(12) United States Patent
Poplack et al.

(10) Patent No.: US 8,532,975 B2
(45) Date of Patent: Sep. 10, 2013

(54) SYSTEM AND METHOD IMPLEMENTING A SIMULATION ACCELERATION CAPTURE BUFFER

(75) Inventors: Mitchell Poplack, San Jose, CA (US); Beshara Elmufdi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 461 days.

(21) Appl. No.: 12/814,350

(22) Filed: Jun. 11, 2010

(65) Prior Publication Data

US 2010/0318344 A1 Dec. 16, 2010

Related U.S. Application Data

(60) Provisional application No. 61/186,712, filed on Jun. 12, 2009.

(51) Int. Cl.
*G06F 9/455* (2006.01)

(52) U.S. Cl.
USPC .......................................................... 703/23

(58) Field of Classification Search
USPC .......................................................... 703/23
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,475,830 A | 12/1995 | Chen et al. | |
| 5,551,013 A | 8/1996 | Beausoleil et al. | |
| 5,960,191 A | 9/1999 | Sample et al. | |
| 6,035,117 A | 3/2000 | Beausoleil et al. | |
| 6,051,030 A | 4/2000 | Beausoleil et al. | |
| 6,389,379 B1 * | 5/2002 | Lin et al. | 703/14 |
| 7,643,983 B2 * | 1/2010 | Lumb et al. | 703/24 |
| 8,032,451 B2 * | 10/2011 | Mordecai | 705/38 |
| 2003/0164835 A1 * | 9/2003 | Burk et al. | 345/506 |

* cited by examiner

*Primary Examiner* — Kamini S Shah
*Assistant Examiner* — Andre Pierre Louis
(74) *Attorney, Agent, or Firm* — Dickstein Shapiro LLP

(57) ABSTRACT

A system and method for capturing and delivering emulation data from a hardware emulation system to a simulator running on a host workstation without considerably sacrificing emulation speed or sacrificing the emulation capacity available for a user's logic design. According to one embodiment, a system, comprises a logic software simulator running on a host workstation; a hardware emulation system having a system bus and an emulator chip, the emulator chip includes: an emulation processor cluster, and a capture buffer connected to the system bus; and a high-speed interface connecting the host workstation to the system bus of the hardware emulator, wherein the capture buffer captures a select output of the emulation processor cluster.

18 Claims, 3 Drawing Sheets

SYSTEM AND METHOD IMPLEMENTING A SIMULATION ACCELERATION CAPTURE BUFFER

The present application claims the benefit of and priority to U.S. Provisional Patent Application No. 61/186,712 filed on Jun. 12, 2009, entitled "Method and System for Improving Simulation Acceleration," which is herein incorporated by reference.

FIELD

The present system and method relate to simulation acceleration, and particularly, to implementing a simulation acceleration capture buffer for outputting data.

BACKGROUND

Electronic design automation (EDA) tools are used for designing, verifying, and implementing electronic systems and component circuits. Within an electronic system, hundreds of integrated circuits, or "chips", may be interconnected on one or more printed circuit boards (PCBs). Today, an integrated circuit can easily comprise billions of interconnected transistors to enable a set of intended functions. Without EDA tools, it would be impractical, if not impossible, to produce and commercialize an integrated circuit of such complexity. Integrated circuits continue to become more complex (i.e., increasing number of transistors) with each successive generation of process technology, allowing more transistors to exist on a footprint of the same or smaller size. Increase in complexity generally translates to longer times for designing, verifying, and implementing a chip design. There exists a need for advances in EDA tool technology to keep chip development within a competitive timeline.

The design process for an integrated circuit generally entails describing the circuit's intended behavior at the register transfer level (RTL) using a hardware description language, such as VHDL, or Verilog, and then reducing the RTL design description into a physical layout of transistor gates. However, because the design is implemented to describe the functions of, perhaps, millions or billions of interconnected transistors, may be inevitable. Thus, the design needs to be verified to ensure that it behaves exactly the way the designers intended. One possible approach is to reduce the RTL code to a physical layout, fabricate a prototype chip, and then test it in the intended environment. However, the impracticality of such an approach goes without saying in the industry, given the turnaround time, the cost of manufacturing, and the number of design revisions that may be required to perfect the design.

Today, verification engineers utilize a range of EDA tool technologies for logic verification that are far more practical than prototyping. One such technology is software simulation, which refers to running ah RTL design through a computer program, a "software simulator", on a general purpose computer or workstation to simulate the operations of the circuit design. Even though software simulation offers faster turnaround time compared to manufacturing an actual device, simulating a complex circuit design can still be painstakingly slow and can take up to months or more to finish. Indeed, it can take many hours or even several days to simulate just a small number of clock cycles of a typical design if a software simulator is used. This is because a typical workstation relies on a single processor to simulate these operations in a sequential or semi-sequential manner. In contrast, most of the operations on a fabricated chip are performed in parallel.

Hardware emulation is a logic verification technology that typically offers the fastest verification speed because a considerable number of operations may be performed in parallel. Parallel execution is achieved by mapping substantially the entire circuit design onto the emulation resources of a hardware platform. Additionally, with hardware emulation, the hardware platform can run almost independently from a workstation because almost all of the verification environment is placed on the hardware platform. Without having to wait for data input from the workstation, the user's design running in the emulator can operate at substantially full hardware speeds. However, the speed enhancement is not without cost. Because almost the whole design would need to be mapped onto the hardware platform, the complexity of the design is generally limited by the emulation resource capacity of the hardware platform.

Simulation acceleration offers a middle ground in terms of verification speed and emulation capacity between software simulation and hardware emulation by separately executing a software portion and a hardware portion of the design. Code apportionment is performed by a compiler in a workstation at compile time. The hardware portion of the design is mapped onto the emulation resources of the hardware emulation system, which executes the code in a substantially parallel manner, while the software portion of the design runs in the software simulator on the workstation. The workstation is connected to and works in conjunction with the hardware platform to verify the circuit logic through the exchange of simulation data. Because the hardware platform may have to wait for data input from the workstation, verification speed is determined in part by the percentage of the design remaining on the workstation and the communication channel width and latency between the workstation and the hardware platform.

SUMMARY

A system and method for capturing and delivering emulation data from a hardware emulation system to a simulator running on a host workstation. According to one embodiment, a system, comprises a logic software simulator running on a host workstation; a hardware emulation system having a system bus and an emulator chip, the emulator chip includes: an emulation processor cluster, and a capture buffer connected to the system bus; and a high-speed interface connecting the host workstation to the system bus of the hardware emulator, wherein the capture buffer captures a select output of the emulation processor cluster.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
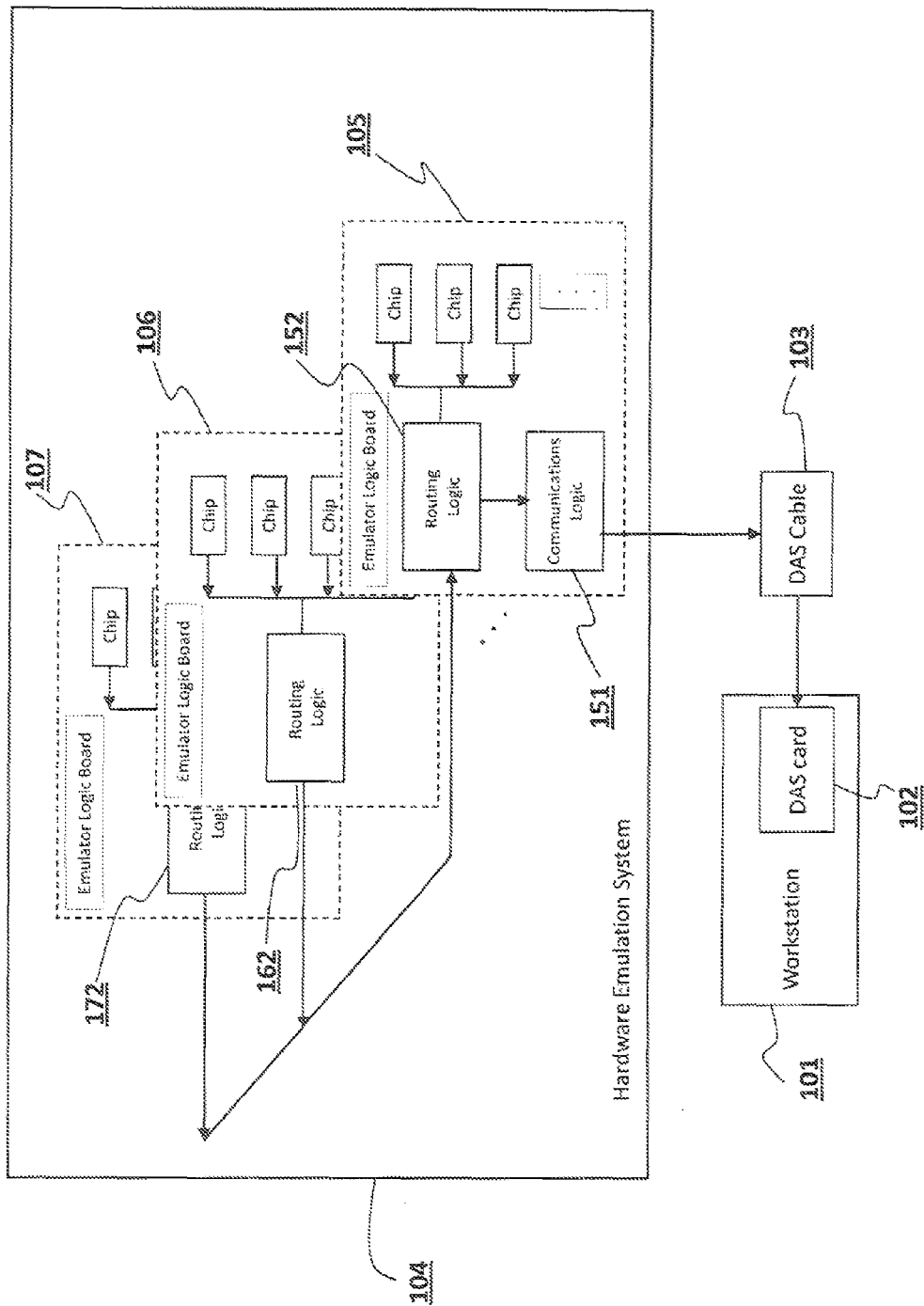
FIG. 1 illustrates a system of the related art for communicating emulation data to the host workstation from the hardware emulation system.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

Hardware emulation systems and simulation acceleration systems are collectively referred to as emulation systems in the subsequent sections. Such emulation systems are commercially available from various vendors, such as Cadence Design Systems, Inc. headquartered in San Jose, Calif.

Typical emulation systems utilize either interconnected programmable logic chips or interconnected processor chips. Examples of hardware logic emulation systems using programmable logic devices are disclosed in, for example, U.S. Pat. No. 5,109,353, entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect" U.S. Pat. Nos. 5,109,353, 5,036,473, 5,475,830 and 5,960,191 are incorporated herein by reference. Examples of hardware logic emulation systems Using processor chips are disclosed in, for example, U.S. Pat. No. 5,551,013 entitled "Multiprocessor for hardware emulation," U.S. Pat. No. 6,035,117 entitled "Tightly coupled emulation processors," and U.S. Pat. No. 6,051,030 entitled "Emulation module having planar array organization." U.S. Pat. Nos. 5,551,013, 6,035,117 and 6,051,030 are incorporated herein by reference.

Historically, the communication mechanism between the workstation and the hardware emulation system involved using a special communications card (e.g., a PAS card or a PdIISA card) that may be installed in a PCI slot on the workstation. The special communications card then connected to an emulator logic board of the hardware emulation system via a high-speed cable. Virtual communications logic was usually compiled into the user's emulated logic design to provide the machinery for the emulated logic to communicate with the simulator running on workstation.

FIG. 1 illustrates a system of the related art for communicating emulation data to the host workstation from the hardware emulation system. Emulation data includes any data that may be needed by a software simulator running on the host, such as data results outputted by a simulator. A host workstation 101 is connected to a hardware emulation system 104 via a DAS cable 103. Particularly, the DAS cable 103 connects a DAS card 102 installed on the host workstation to an emulator logic board 105 on the hardware emulation system 104. Traditionally, emulation data generated on emulator logic boards not connected to the DAS cable 103, such as boards 106 and 107, would have to be routed to the emulator logic board 105 connected to the DAS cable 103. More particularly, the emulation data would have to be routed to communications logic 151. Communications logic 151 and routing logic 152, compiled into the user's logic design, are emulated using the emulation resources (e.g., emulator chips) on emulator logic board 105. Communications logic 151 provides the mechanism for the emulated logic design on the hardware emulation system to communicate with the simulator running on the workstation and vice versa. Routing logic 152 provides the mechanism for routing emulation data signals generated by emulator chips on emulator logic board 105, or by emulator chips on logic boards 106 and 107, to communications logic 151. Routing logics 162 and 172 may also need to be emulated for routing the emulation data signals from emulator logic boards 106 and 107, respectively, to the routing logic 152 on emulator logic board 105. Emulation data signals that have been routed to communications logic 151 are buffered and shifted out sequentially onto the DAS cable 103 along with strobe signals. Strobe signals are used by the DAS card 102 to determine the sequence of the emulation data received and reconstruct the emulation data buffer that was sent.

There are at least two significant drawbacks to this approach. One drawback is the fact that significant emulations resources are wasted in having to emulate communications logic 151 and routing logics 152, 162, and 172. This reduces considerably the emulation capacity available for emulating the user's logic design. Another major drawback is the time it takes to route the emulation data signals from all the emulator chips to the communications logic 151. Because the emulation data signals are usually routed through a series of scheduled events, there are usually considerable time delays between when the data signals are generated by the emulator chips and when the data signals arrive at communications logic 151. For instance, several emulation steps may be required to route a set of data signals generated by emulator chips on the emulator logic board 106 to routing logic 162. Another several emulation steps may be required to route the set of data signals from routing logic 162 to the communications logic 151. These delays translate to a considerably slower emulated logic design.

In view of the foregoing, there exists a need for a system and method for communicating data from the host workstation to the hardware emulation system without considerably sacrificing emulation speed or sacrificing the emulation capacity available for a user's logic design.

Figure 2:
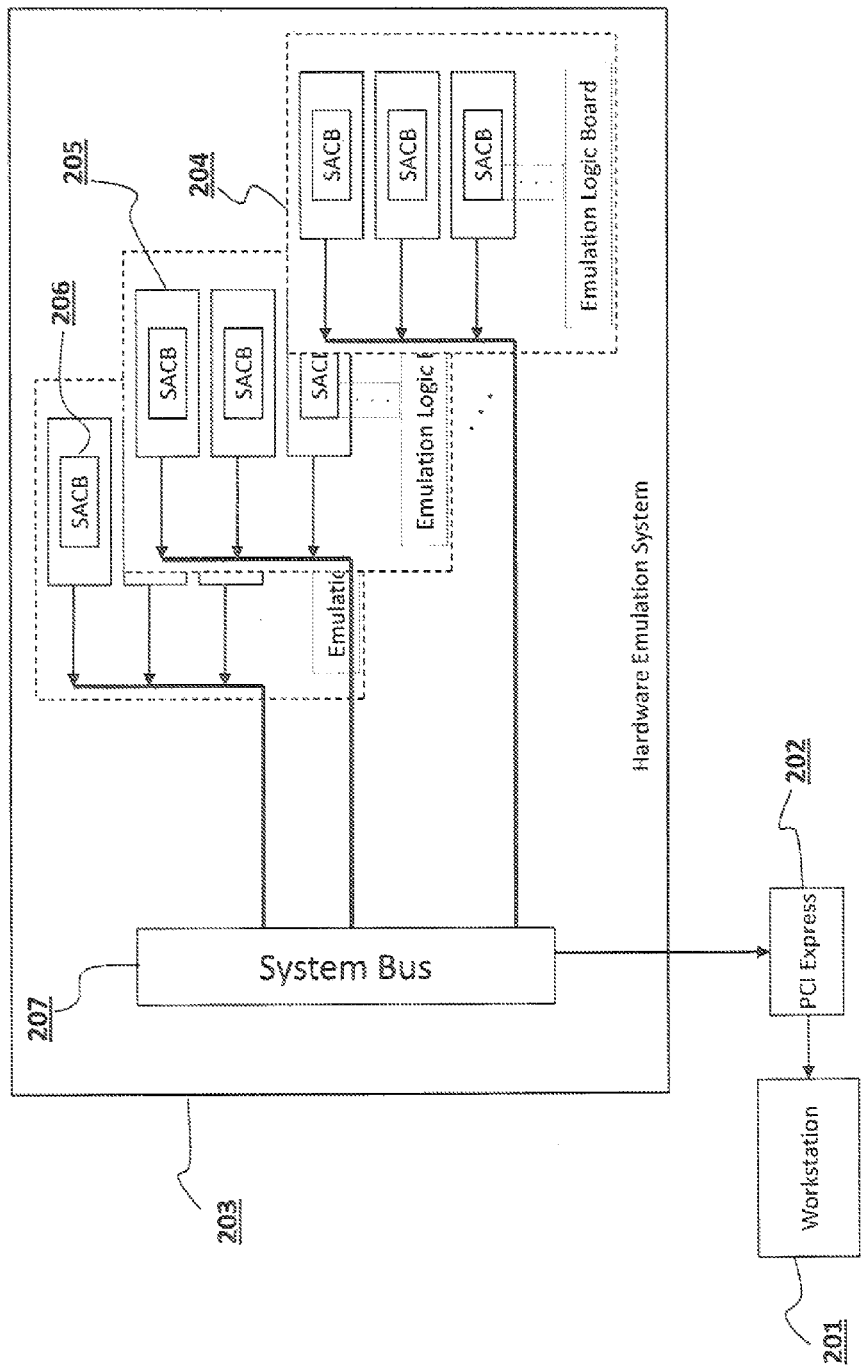
FIG. 2 illustrates an exemplary system for communicating emulation data from a hardware emulation system to a host workstation.

The system and method presently disclosed allows a hardware emulation system to capture and deliver emulation data to a simulator running on a host workstation without considerably sacrificing emulation speed or sacrificing the emulation capacity available for a user's logic design. FIG. 2 illustrates an exemplary system for communicating emulation data from a hardware emulation system 203 to a host workstation 201. Host workstation 201 is connected to the system bus 207 of the hardware emulation system 203 via a high-speed interface, such as a PCI Express card interface 202. As shown in FIG. 2, emulator logic boards 204, each containing multiple emulator chips 205, are connected to the system bus 207.

Each emulator chip 205 contains an SACB (Simulation Acceleration Capture Buffer) 206 that is also connected to the system bus 206. An SACB 206 is a dual-ported memory that is used to capture selected emulation data on each emulator chip 205. Being dual-ported, emulation data stored on the SACB 206 can be read anytime without interfering with emulation operations. Using the system bus 207, the host workstation 201 can read emulation data directly from each emulator chip 205 without having to first move the data between emulator chips or between emulator boards. This way, the time consuming steps of using emulated routing resources to move data around are eliminated. Data that have been captured in an SACB 206 become readily accessible to the host workstation 201 through the system bus 207.

Figure 3:
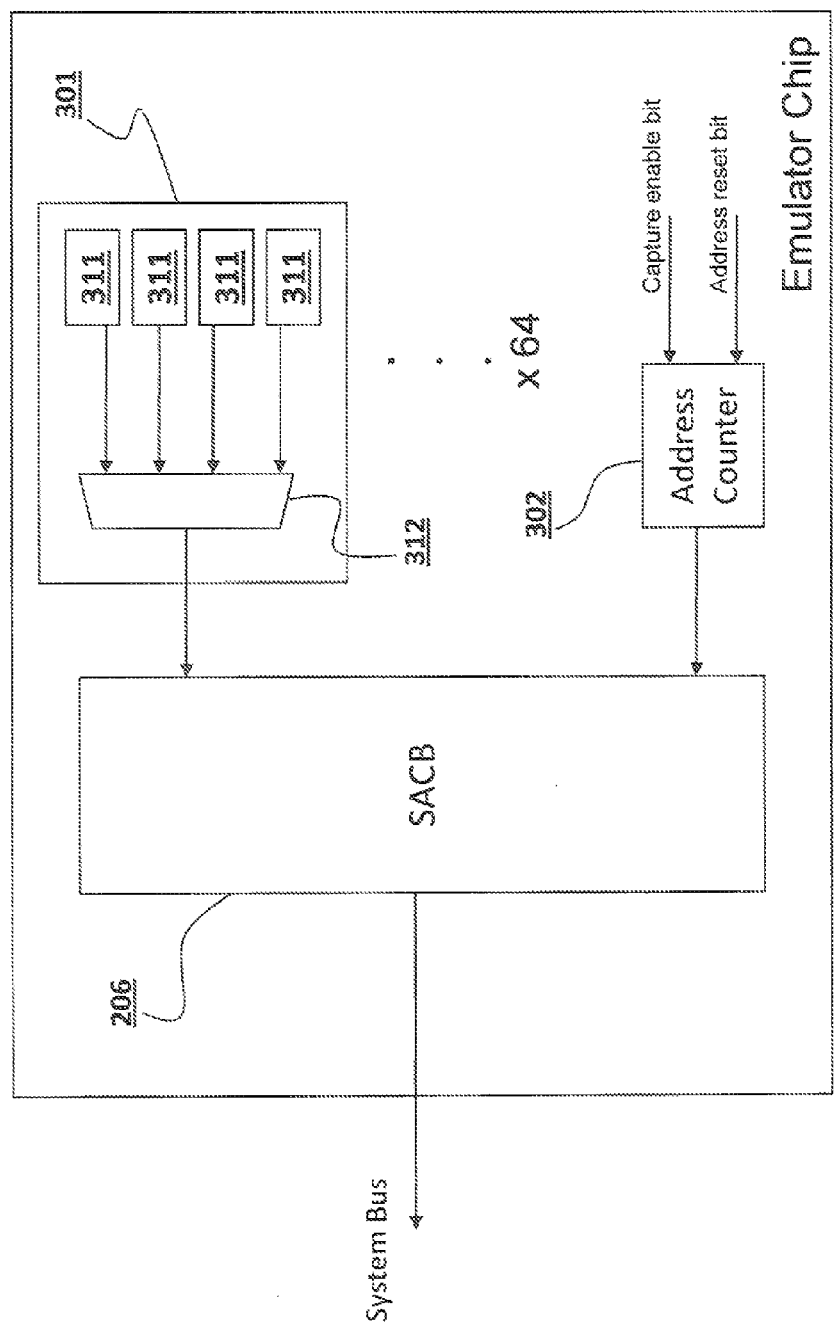
FIG. 3 illustrates an exemplary emulator chip including an SACB and multiple processor clusters.

FIG. 3 illustrates an exemplary emulator chip 205 including an SACB 206 and multiple processor clusters 301. As shown, each processor cluster 301 includes four emulation processors 311. There is also one 4-way mux 312 in every processor cluster 301 that selects one of the four processor output signals. The selected processor output signal is driven to the SACB 206. In the embodiment illustrated in FIG. 3, there are 64 processor clusters 301. Thus, there are 64 processor output signals connected to the SACB 206 and 64 bits of data may be captured at a time during any emulation step. As shown, there is a capture enable signal that indicates that the data being driven out of the 4-way muxes 312 should be captured by the SACB 206. If this capture enable signal is high, then data on the trace outputs are written to the SACB 206 at an address pointed to by an address counter 302. After each write to the SACB 206, the address counter 302 increments. There is also an address reset signal, which, when enabled, resets the address counter 302 to 0. Both the capture enable signal and the address reset signal are Hardware Control Bits (HCBs).

HCBs are generated based on information stored in a field of a Control Store Word (CSW). CSWs are generated at compile time and generally include instructions used to control or direct the operations of the emulation hardware at various emulation cycles. Similarly, HCBs generated from CSWs are the mechanism that the scheduler uses to control various portions of the emulation hardware at runtime. In the case of the capture enable signal, it is used to control when an SACB 206 captures data. Because HCBs are derived from CSWs, HCBs are also determined at compile. This means that the time frames at which an SACB 206 captures data are a series of statically scheduled events. While the capture enable signal, an HCB, controls when data should be captured by the SACB 206, control signals (TCBs) for the 4-way muxes 301 are used to specify which bits are of interest to the simulator and are thus captured by the SACB 206. TCBs are also derived from information stored in a field of a CSW, and thus, are determined at compile time.

While it may be possible to schedule (i.e., during static scheduling at compile time) the SACB 206 to capture the bits of interest as soon as they become available from the processor clusters 301, this type of scheduling may not be desired for reasons of efficiency. As FIG. 3 illustrates, 64 bits of data are captured at a time. Thus, if there are only a few meaningful bits (e.g., 5 bits) during a capture step, the rest of the captured bits (e.g., 59 bits) are basically "junk" bits. This wastes both the space in the SACB 206 and the time to upload the data to simulator on the host workstation. Thus, to optimize the space available on the SACB 206, the scheduler may schedule the capturing step to coincide with when an optimal or a considerable number of meaningful bits are available. Once all the bits of interest to the simulator have been captured in the SACB 206, a ready or valid bit may be written to the end of the SACB 206 to indicate the end of the set of captured data. It should be noted that while the simulator may decide to wait until the end of a set of captured data before reading data from the SACB 206, the embodiment of FIG. 3 supports reading data from the SACB 206 using the system bus even while new emulation data is being captured onto the SACB 206.

Embodiments and methods as described herein have significant advantages over prior art implementations. As will be apparent to one of ordinary skill in the art, other similar arrangements are possible within the general scope. The embodiments and methods described above are intended to be exemplary rather than limiting, and the bounds should be determined from the claims.

We claim:

1. A system, comprising:
a logic software simulator running on a host workstation;
a hardware emulation system having a system bus and an emulator chip, the emulator chip includes: an emulation processor cluster;
a capture buffer connected to the system bus that stores data received from the emulation processor cluster, said emulation processor cluster being one of at least four emulation processor clusters connected to selected inputs of the multiplexer; and
a high-speed interface connecting the host workstation to the system bus of the hardware emulator, wherein the capture buffer captures a select output of at least one of the emulation processor clusters, and wherein the capture buffer outputs data stored therein to the host workstation through the system bus while the capture buffer is capturing the select output of the emulation processor cluster.

2. The system of claim 1, wherein a statically-scheduled capture enable bit activates the capturing of the select output of the emulation processor cluster.

3. The system of claim 1, wherein the select output of the emulation processor cluster is determined by a statically-scheduled trace control bit.

4. The system of claim 1, wherein the high-speed interface is a PCI Express interface.

5. The system of claim 1, wherein the capture buffer is a dual-ported memory.

6. The system of claim 1, wherein the software simulator reads data directly from the capture buffer over the high-speed interface.

7. A method for capturing and delivering emulation data on a hardware emulation system including a system bus, a high-speed interface adapted to connect a host workstation to the system bus, and an emulator chip that has an emulation processor cluster and a capture buffer connected to the system bus, the method comprising:
selecting an output of the emulation processor cluster; and
capturing the selected output of the emulation processor cluster in the capture buffer, said emulation processor cluster being one of at least four emulation processor clusters connected to selected inputs of a multiplexer, wherein data stored in the capture buffer are read by the host workstation through the system bus while the capture buffer is capturing the selected output of the emulation processor cluster.

8. The method of claim 7, wherein the high-speed interface is a PCI Express interface.

9. The method of claim 7, wherein the capture buffer is a dual-ported memory.

10. The method of claim 7, wherein the host workstation reads data directly from the capture buffer over the high-speed interface.

11. The method of claim 7, wherein a statically-scheduled capture enable bit activates capturing the selected output of the emulation processor cluster.

12. The method of claim 7, wherein the selected output of the emulation processor cluster is determined by a statically-scheduled trace control bit.

13. A system, comprising:
a hardware emulation system having a system bus and an emulator chip, the emulator chip comprising: an emulation processor clusters; and
a multiplexer connected with the emulation processor clusters; and
a capture buffer connected with the multiplexer and the system bus, wherein the capture buffer stores data received from the emulation processor cluster, said emulation processor cluster being one of at least four emulation processor clusters connected to selected inputs of the multiplexer; and
a high-speed interface connecting a host workstation, running a logic software simulation, to the system bus of the hardware emulator, wherein the capture buffer captures a select output of at least one of the emulation processor clusters and outputs data stored therein to the host workstation through the system bus.

14. The system of claim 13, wherein data is output directly from the capture buffer over the high-speed interface.

15. The system of claim 13, wherein a statically-scheduled capture enable bit activates the capturing of the select output of the emulation processor cluster.

16. A method for capturing and delivering emulation data on a hardware emulation system including a system bus, a high-speed interface adapted to connect a host workstation to the system bus, and an emulator chip that comprises an emulation processor cluster, a multiplexer connected with the emulation processor cluster, and a capture buffer connected with the multiplexer and the system bus, the method comprising:
  selecting an output of the emulation processor cluster; and
  capturing the selected output of the emulation processor cluster in the capture buffer by way of the multiplexer, said emulation processor cluster being one of at least four emulation processor clusters connected to selected inputs of the multiplexer, wherein data stored in the capture buffer are read by the host workstation through the system bus while the capture buffer is capturing the selected output of the emulation processor cluster.

17. The method of claim 16, wherein the host workstation reads data directly from the capture buffer over the high-speed interface.

18. The method of claim 16, wherein a statically-scheduled capture enable bit activates capturing the selected output of the emulation processor cluster.

* * * * *